United States Patent
Alva

(10) Patent No.: US 7,009,872 B2
(45) Date of Patent: Mar. 7, 2006

(54) MRAM STORAGE DEVICE

(75) Inventor: Mauricio Huerta Alva, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 226 days.

(21) Appl. No.: 10/743,665

(22) Filed: Dec. 22, 2003

(65) Prior Publication Data
US 2005/0162897 A1    Jul. 28, 2005

(51) Int. Cl.
*G11C 11/00*    (2006.01)

(52) U.S. Cl. ............... 365/158; 365/230.06; 365/220; 365/230.03

(58) Field of Classification Search ............... 365/158, 365/230.06, 230.03, 220

See application file for complete search history.

(56) References Cited

U.S. PATENT DOCUMENTS

| | | | |
|---|---|---|---|
| 6,404,647 B1 | | 6/2002 | Minne |
| 6,760,865 B1 * | | 7/2004 | Ledford et al. ............. 365/201 |
| 6,765,831 B1 * | | 7/2004 | Oikawa et al. ............. 365/200 |
| 6,829,191 B1 * | | 12/2004 | Perner et al. ............... 365/220 |
| 6,901,025 B1 * | | 5/2005 | Ooishi ........................ 365/233 |
| 2003/0023926 A1 | | 1/2003 | Davis et al. |
| 2005/0068802 A1 * | | 3/2005 | Tanaka ........................ 365/145 |
| 2005/0135165 A1 * | | 6/2005 | Smith et al. ................. 365/200 |

* cited by examiner

*Primary Examiner*—Tuan T. Nguyen

(57) ABSTRACT

A memory device having a main controller including a host interface and a device interface, a first plurality of arrays of magneto-resistive random access memory (MRAM) cells, a first device controller coupled to the device interface and the first plurality of arrays, a second plurality of arrays of MRAM cells, and a second device controller coupled to the device interface and the second plurality of arrays. The first device controller is configured to communicate with the device interface to pass first data between the first plurality of arrays and the host interface, and wherein the second device controller is configured to communicate with the device interface to pass second data between the second plurality of arrays and the host interface.

16 Claims, 6 Drawing Sheets

MRAM STORAGE DEVICE

BACKGROUND

As the volume of data generated by computing devices increases, the importance of memory space rises. Over the past several years, increases in demand for memory has caused a parallel increase in the capacity of mass memory storage devices. Conventionally, these mass memory storage devices comprise rotating mass storage devices such as disk drives. Although great strides have been made in disk drive design in terms of capacity and speed, the versatility of conventional disk drives may be limited.

A first limitation is that disk drive technology could soon reach a limit imposed by the superparamagnetic effect (SPE). SPE is a physical phenomenon in which the energy that holds the magnetic spin in the atoms forming each bit becomes susceptible to ambient thermal energy and, therefore, is subject to random flipping that corrupts the data that the atoms represent. Unfortunately, the miniaturization currently popular in disk drive manufacture may amplify the SPE problem.

A second limitation of disk drives relates to speed. Because disk drives require moving parts, the speed at which data can be stored on or accessed from the drive may be limited by the speed with which the various mechanical parts of the drive can move. To increase this speed, manufacturers have continually increased the speeds at which the internal disks of the drives rotate. However, along with this increased angular velocity comes increased air turbulence and vibration that can cause misregistration of the disk tracks. In addition, to achieve high capacity and high speed, disk drives must be very precise in operation.

Typically, disk drives comprise one or more disks and a plurality of read-write heads that record and retrieve data from circumferential tracks formed in the disks. The heads are normally moved with servomechanical actuator arms. To properly perform read/write operations, the heads must be positioned in very close proximity to the disks, the separation between the heads and the disks typically measuring only fractions of microinches. This level of precision often results in a very fragile mechanism that can be easily damaged by moderate to large vibrations. Such susceptibility may be particularly disadvantageous for portable computing devices that are often bumped and/or jolted through normal use.

In addition to fragility, disk drives may further present the disadvantage of requiring relatively large amounts of power to operate. This again relates to the fact that disk drives have moving parts that require electrical power. Although not a major concern for plug-in devices such as desktop computers, this power consumption may be problematic for portable devices.

SUMMARY

One aspect of the present invention provides a memory device. The memory device comprises a main controller including a host interface and a device interface, a first plurality of arrays of magneto-resistive random access memory (MRAM) cells, a first device controller coupled to the device interface and the first plurality of arrays, a second plurality of arrays of MRAM cells, and a second device controller coupled to the device interface and the second plurality of arrays. The first device controller is configured to communicate with the device interface to pass first data between the first plurality of arrays and the host interface, and wherein the second device controller is configured to communicate with the device interface to pass second data between the second plurality of arrays and the host interface.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
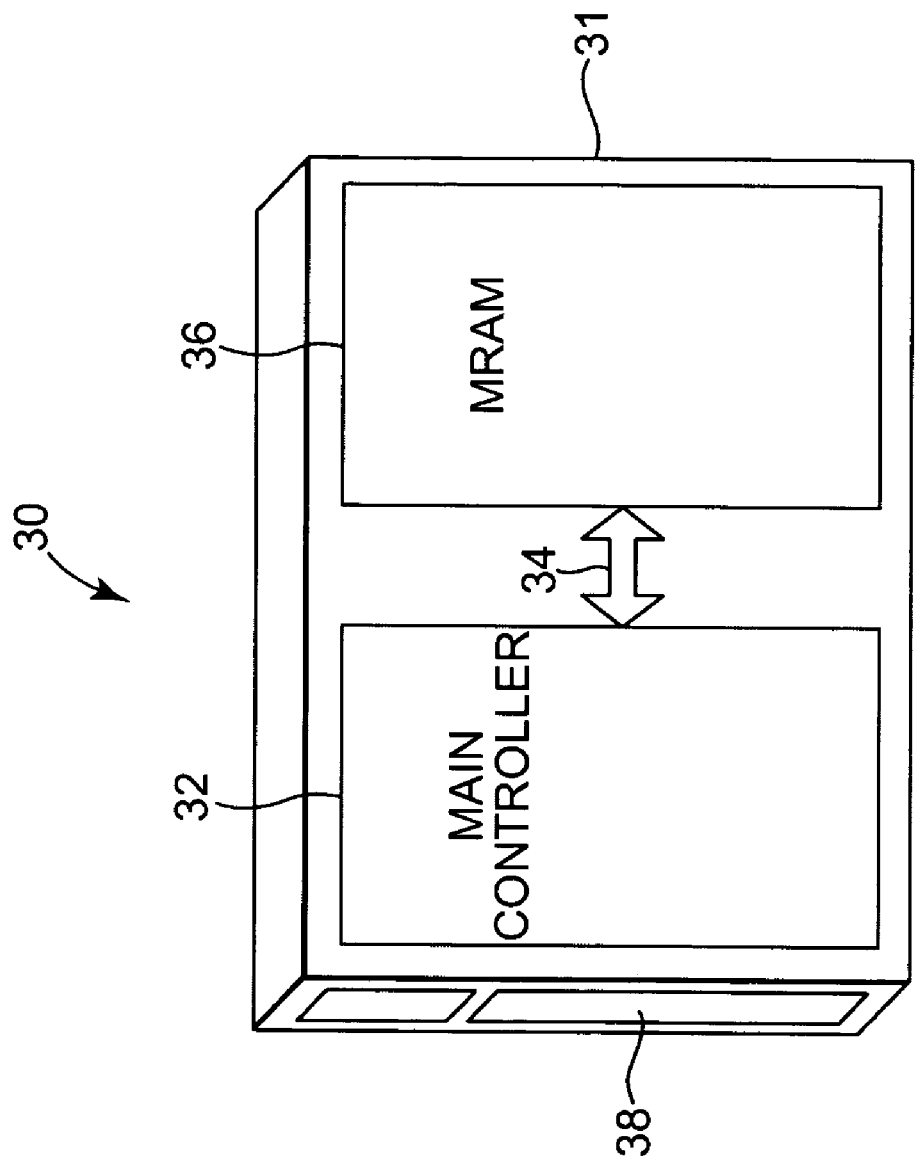
FIG. 1 is a diagram illustrating an exemplary embodiment of an MRAM storage device.

FIG. 1 is a diagram illustrating an exemplary embodiment of a magneto-resistive random access memory (MRAM) storage device 30. MRAM storage device 30 can be used to replace a disk drive in a computer system. MRAM storage device 30 includes a housing 31, a main controller 32, an MRAM 36, and a mechanical host interface 38. Main controller 32 is electrically coupled to MRAM 36 through communication link 34 and to mechanical host interface 38.

Housing 31 is a metal, plastic, or composite material housing for at least partially enclosing main controller 32, MRAM 36, communication link 34, and mechanical host interface 38. Housing 31 can be provided in many different form factors for use in a variety of applications. For example, housing 31 can be in a drive form factor that is popular for use in desktop personal computers (PCs), such as a 5.25 inch or 3.5 inch form factor. Housing 31 can be in a drive form factor that is popular for use in portable devices such as laptop computers, such as a 2.5 inch, 1.8 inch, 1.3 inch, or 1 inch form factor. MRAM storage device 30 can be provided in these form factors and other form factors as a replacement to current disk drives. In addition, MRAM storage device 30 can be provided in the form of a small PCI card, a full length PCI card, or can be built into a motherboard or other card.

Main controller 32 controls the passing of data between MRAM 36 and a host (not shown in FIG. 1). Main controller 32 includes a combination of embedded software or firmware and hardware. Main controller 32 is compatible with varying storage capacities of MRAM 36.

MRAM 36 includes a plurality of memory cells arranged in a plurality of arrays. MRAM 36 is scalable for providing varying storage capacities and data access rates. The storage capacity of MRAM 36 can be as small as a few megabytes to as large as hundreds of gigabytes depending upon the number of arrays and the total number of memory cells.

In one embodiment, communication link 34 is a serial communication link that comprises a high-speed serial interface capable of transferring data at rates higher than approximately 100 Mbytes per second. In this embodiment, communication link 34 uses as few as two wires to electrically couple main controller 32 to MRAM 36. A small number of communication wires may reduce and simplify the interconnection wiring between main controller 32 and MRAM 36. Therefore, main controller 32 can be fabricated entirely on a separate semiconductor chip that can be wired to any number of MRAM semiconductor chips to obtain the desired storage capacity. Main controller 32 and MRAM 36 can be distributed on different printed circuit boards (PCBs). Communication link 34 may preserve the signal integrity between PCBs and minimizes the cost of electrically coupling the PCBs.

Mechanical host interface 38 comprises an electrical contact area that establishes electrical communication with a reciprocal electrical contact area of a host to permit communication between main controller 32 of MRAM storage device 30 and the host. In particular, mechanical host interface 38 comprises electrically conductive elements provided in the forms of electrically conductive contact pins, card-receiving slot, etc. that are suited for permanently or removably establishing contact with reciprocating electrically conductive contact elements.

To a host, MRAM storage device 30 is a plurality of consecutive blocks of data. The blocks can be of variable size. The blocks are addressed by the host using logical block addressing (LBA). Main controller 32 of MRAM storage device 30 writes data to MRAM 36 in fixed size blocks called sectors. A sector is comprised of data bytes and parity bytes. A typical sector has 512 bytes. Main controller 32 addresses a sector using physical block addressing (PBA).

During a read operation, a host transmits LBA addresses to main controller 32 through mechanical device interface 38. Main controller 32 translates the LBA addresses to PBA addresses and reads the requested data from the specified addresses in MRAM 36. Main controller 32 transmits the requested read data to the host through mechanical device interface 38.

During a write operation, a host transmits LBA addresses and data to main controller 32 through mechanical device interface 38. Main controller 32 translates the LBA addresses to PBA addresses and writes the data to the specified addresses in MRAM 36.

Figure 2:
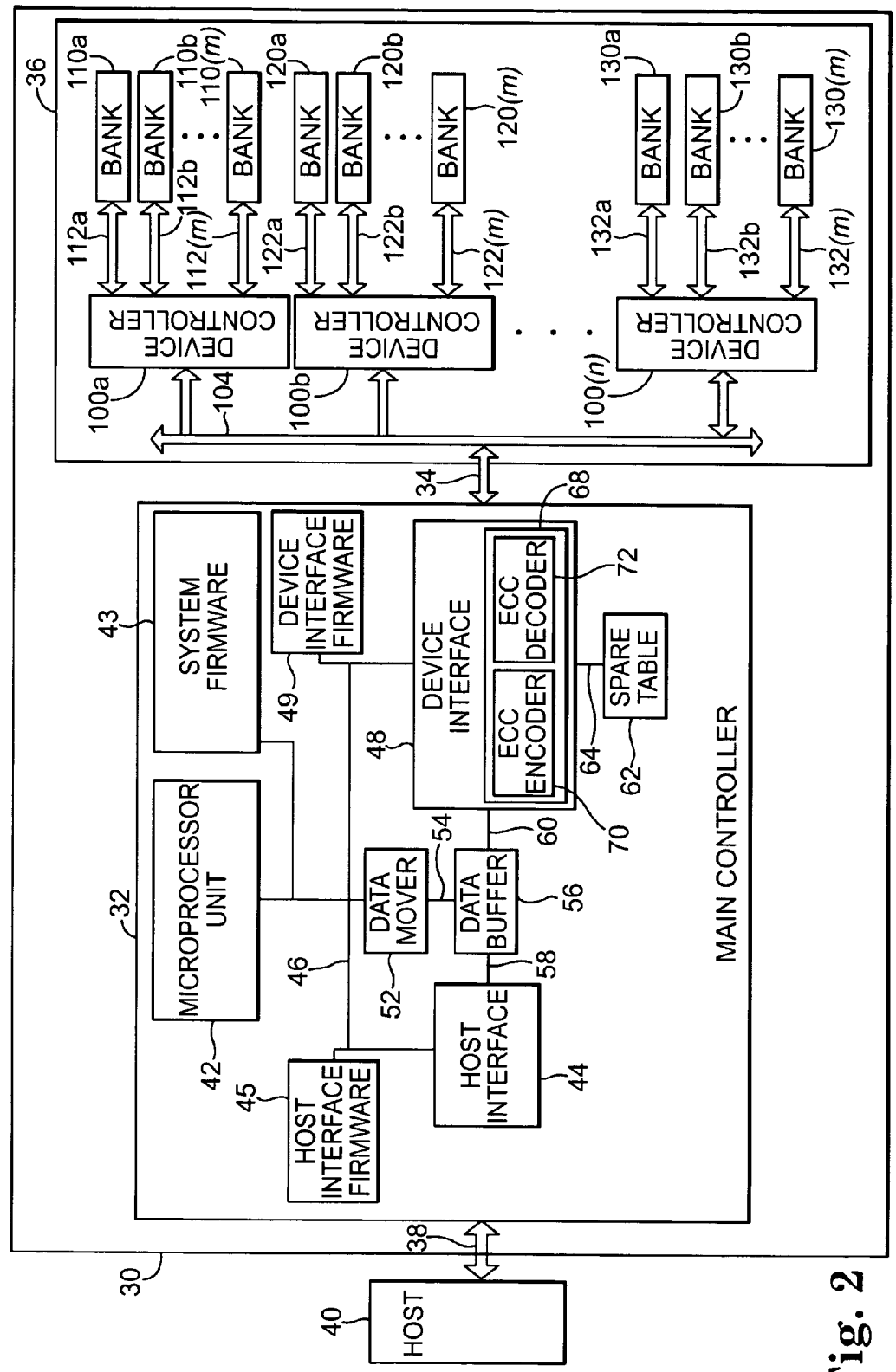
FIG. 2 is a block diagram illustrating an exemplary embodiment of an MRAM storage device with a host.

FIG. 2 is a block diagram illustrating an exemplary embodiment of MRAM storage device 30 with a host 40. Host 40 is electrically coupled to main controller 32 through mechanical host interface 38. Main controller 32 is electrically coupled to MRAM 36 through communication link 34.

Main controller 32 includes a microprocessor unit 42, a system firmware module 43, a host interface 44, a host interface firmware module 45, a data mover 52, a data buffer 56, a device interface 48, a device interface firmware module 49, and a spare table 62. Microprocessor unit 42 is electrically coupled to host interface 44, data mover 52, device interface 48, and one or more non-volatile memories (not shown) that store system firmware module 43, host interface firmware module 45, and device interface firmware module 49 through path 46. Data mover 52 is electrically coupled to data buffer 56 through path 54. Host interface 44 is electrically coupled to data buffer 56 through path 58. Data buffer 56 is electrically coupled to device interface 48 through path 60. Device interface 48 is electrically coupled to spare table 62 through path 64. Device interface 48 includes error detection and correction (ECC) circuit 68. ECC circuit 68 includes ECC encoder 70 and ECC decoder 72.

MRAM 36 includes any number n of device controllers 100 as represented by device controllers 100a through 100(n), where device controller 100(n) represents the nth device. Device controller 100a is electrically coupled to any number m of banks 110, as represented by banks 110a–110(m), through corresponding paths 112a–112(m) where bank 110(m) represents the mth bank and path 112(m) represents the mth path. Device controller 100b is electrically coupled to any number m of banks 120, as represented by banks 120a–120(m), through corresponding paths 122a–122(m) where bank 120(m) represents the mth bank and path 122(m) represents the mth path. Device controller 100(m) is electrically coupled to any number m of banks 130, as represented by banks 130a–130(m), through corresponding paths 132a–132(m) where bank 130(m) represents the mth bank and path 132(m) represents the mth path. In other embodiments, each device controllers 100 may be electrically coupled to a different number of banks. Communication link 34 is electrically coupled to MRAM 36 internal communication link 104. Internal communication link 104 is electrically coupled to device controllers 100a through device controller 100(n). In one embodiment, internal communication link 104 is a serial communication link.

Host 40 is a super computer, a workstation, a server, a disc array controller, or other system that uses a storage device. Host 40 communicates with host interface 44 through mechanical host interface 38. Mechanical host interface 38 comprises a parallel or serial bus and is a Small Computer System Interface (SCSI), Integrated Drive Electronics (IDE), Serial AT Attachment (SATA), Industry Standard Architecture (ISA), Personal Internet Client Architecture (PCA), Peripheral Component Interconnect (PCI), Universal Serial Bus (USB), InfiniBand, or other suitable bus.

Microprocessor unit 42 executes instructions from system firmware module 43 to control the various components of main controller 32. Microprocessor unit 42 executes instructions from host interface firmware module 45 to control host interface 44. Microprocessor unit 42 executes instruction from device interface firmware module 49 to control device interface 48. Microprocessor unit 42 also executes control over data mover 52, data buffer 56, and spare table 62. Microprocessor unit 42 executes commands and software specific to the operation of MRAM storage device 30.

Data buffer 56 is a buffer between host interface 44 and device interface 48. During a read operation, data buffer 56 temporarily stores read data from device interface 48 that was retrieved from MRAM 36. The host interface transfers the read data from data buffer 56 to host 40. During a write operation, data buffer 56 temporarily stores write data from host interface 44 that was received from host 40. Device interface 48 transfers the write data from data buffer 56 to MRAM 36.

Data mover 52 arbitrates the access to data in data buffer 56 between host interface 44 and device interface 48. During a read operation, data mover 52 controls the passing of data from data device interface 48 to data buffer 56 and from data buffer 56 to host interface 44. During a write operation, data mover 52 controls the passing of data from host interface 44 to data buffer 56 and from data buffer 56 to device interface 48.

Host interface firmware module 45, through host interface 44, communicates with host 40 and receives commands and/or write data from host 40 and provides read data to host 40. Host interface firmware module 45 acts as a master and responds to requests from host 40 and initiates all data transfers to and from MRAM 36. Host interface firmware module 45 parses and validates commands received from host 40 and executes the commands. During a write operation, host interface firmware module 45 generates an internal write command to pass data to MRAM 36 from host 40. During a read operation, host interface firmware module 45 generates an internal read command to pass data to host 40 from MRAM 36. Read and write commands received by host interface 44 from host 40 are based on logical block addressing (LBA).

Device interface firmware module 49, through device interface 48, communicates with MRAM 36 and receives read data from MRAM 36 and provides commands and write data to MRAM 36. Device interface firmware module 49 acts as a slave and satisfies all requests from host interface firmware module 45. All requests sent from host interface firmware module 45 to device interface firmware module 49 are in terms of LBA. Device interface firmware module 49 translates LBA addresses to physical block addresses (PBA) for read and write operations to MRAM 36. During a read operation, device interface firmware module 49 passes a read command and PBA address(es) to MRAM 36 through communication link 34. MRAM 36 reads the data stored at the PBA address(es) and passes the data to device interface 48 through communication link 34. During a write operation, device interface firmware module 49 passes a write command, data, and PBA address(es) to MRAM 36 through communication link 34. MRAM 36 writes the data to the PBA address(es).

ECC circuit 68 provides error detection and correction functions including ECC encoding and ECC decoding. An error correction code associated with a slice of data is stored and utilized to determine if an error has occurred in the slice and to then correct the erroneous bit. Typical ECCs provide guaranteed single bit error correction and double-bit error detection. Additionally, many multi-bit errors can be detected. More elaborate codes have been created which provide better detection and correction capability. These codes further reduce the possibility of data corruption at the expense of greater computational overhead.

ECC encoder 70 encodes data from host 40 before the data is stored in MRAM 36. ECC decoder 72 decodes ECC encoded data retrieved from MRAM 36 before the data is passed to host 40.

In addition to using ECC, device interface 48 uses spare table 62 to improve the storage efficiency of MRAM 36. If MRAM 36 has defects that are not correctable by ECC circuit 68, spare table 62 is used. If MRAM 36 is perfect memory, or all the defects are corrected by ECC circuit 68, then spare table 62 is not needed.

Spare table 62 is used to replace defective memory sections in MRAM 36 with replacement memory sections in MRAM 36. Spare table 62 includes original addresses that are addresses to defective memory sections in MRAM 36 and spare addresses that are addresses to replacement memory sections in MRAM 36. Each spare address corresponds to an original address.

Microprocessor unit 42 executes instructions from device interface firmware module 49 to compare original read addresses and original write addresses to original addresses in spare table 62. In the event of a match between an original read address or an original write address and one of the original addresses in spare table 62, device interface firmware module 49 substitutes the corresponding spare address from spare table 62 for the matching original read address or matching original write address. Device interface firmware module 49 reads data from or writes data to the substituted spare address in MRAM 36, instead of the matching original read address or matching original write address.

In practice, device interface 48 receives a block of original addresses for reading data from or writing data to MRAM 36. Microprocessor unit 42 executes instructions from device interface firmware module 49 to sort through the block of original read or write addresses and finds all addresses in the block of original read or write addresses that match original addresses in spare table 62. All matching addresses in the block of original read or write addresses are removed and replaced with corresponding spare addresses from spare table 62.

Spare table 62 is created as MRAM 36 is tested during manufacture of MRAM storage device 30. A test program reads and writes all address locations in MRAM 36 to identify the number of errors in each section of MRAM 36 to obtain an error count. A section of MRAM 36 is classified as defective if the number of errors, i.e. the error count, for the section of MRAM 36 exceeds the number of errors that can be corrected by ECC circuit 68. The address of a defective MRAM 36 section is stored as an original address in spare table 62, and the address of a replacement memory section is stored as the corresponding spare address in spare table 62. MRAM 36 includes a predetermined number of replacement sections, such as ten percent of the stated storage capacity of MRAM 36.

Device controllers 100*a* through 100(*n*) convert the serial signals received from device interface 48 through communication link 34 to parallel signals for accessing the MRAM banks associated with each device controller. Each device controller 100*a*–100(*n*) can access the MRAM banks associated with the device controller 100*a*–100(*n*) in parallel. The greater the number of associated MRAM banks for each device controller 100*a*–100(*n*), the greater the amount of data that can be accessed in parallel. For example, if the read speed of an MRAM bank is 20 Mbytes per second, by providing five MRAM banks in parallel the total transfer rate is 100 Mbytes per second. Adding additional MRAM banks to a device controller 100*a*–100(*n*) increases the data transfer rate and storage capacity of MRAM 36, resulting in a scalable MRAM storage device 30.

MRAM banks 110*a*–110(*m*) through 130*a*–130(*m*) each comprise an array of memory cells and circuitry for reading data from and writing data to the array of memory cells. Increasing the size of the array of memory cells increases the storage capacity of MRAM 36, resulting in a scalable MRAM storage device 30. In addition, each MRAM bank comprises circuitry for communicating with the device controller associated with the MRAM bank.

In one embodiment, signals between host interface firmware module 45 and device interface firmware module 49 include function calls and shared status data. The logic functions supported include read, write, and abort. Device interface firmware module 49 communicates its state of execution: busy, idle, etc., to host interface firmware module 45.

Upon receiving a read command from host 40, host interface firmware module 45 sends a read request to device interface firmware module 49. The read request includes the starting LBA address and the size of the data transfer. Device interface firmware module 49, upon receiving the read request, performs the LBA address to PBA address translation. The PBA address indicates which device controller and which MRAM bank(s) have the requested data.

Device interface firmware module 49 compares the block of PBA read addresses to original addresses in spare table 62. In the event of a match, the matching PBA read address is replaced with the spare address corresponding to the matching original address. The compare operation continues until all matching original read addresses are replaced by corresponding spare addresses.

To read MRAM 36, device interface firmware module 49 sends a read command and a read start address to MRAM 36. MRAM 36 transfers a section of data beginning at the start address to device interface 48, and transmits the next sequentially addressed sections of data to device interface 48. The received ECC encoded data is decoded and corrected by ECC decoder 72 to provide data originally received for storage in MRAM 36.

The read data is passed to data buffer 56. Data mover 52, which controls data buffer 56, controls the passing of the data from data buffer 56 to host interface 44. Host interface 44 passes the data to host 40.

Upon receiving a write command request and data to store from host 40, host interface 44 transfers the data to data buffer 56. Host interface firmware module 45 sends a write request to device interface firmware module 49. The write request includes the starting LBA address and the size of the data transfer. Device interface firmware module 49, upon receiving the write request, performs the LBA address to PBA address conversion.

Device interface firmware module 49 compares the block of PBA write addresses to original addresses in spare table 62. In the event of a match, the matching PBA write address is replaced with the spare address corresponding to the matching original address. The compare operation continues until all matching original write addresses are replaced by corresponding spare addresses.

To write MRAM 36, ECC encoder 70 encodes the data. Device interface firmware module 49 sends a write command, a write start address, and the data to MRAM 36. MRAM 36 writes a section of data beginning at the start address and writes the next sequentially addressed sections of data to MRAM 36.

Host interface firmware module 45 can stop a read or write operation by sending an abort request to device interface firmware module 49. Device interface firmware module 49 gracefully stops the current operation and sends a status signal back to host interface firmware module 45.

Figure 3:
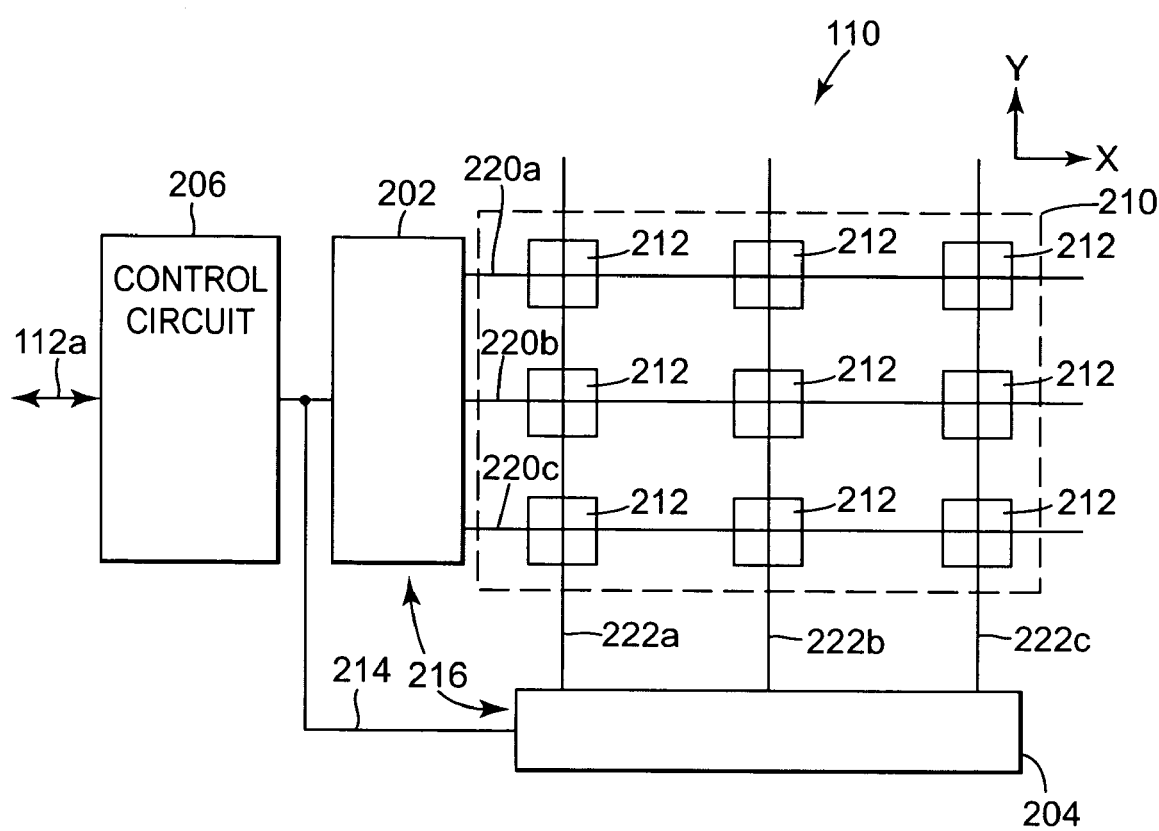
FIG. 3 is a diagram illustrating an exemplary embodiment of an MRAM bank.

FIG. 3 is a diagram illustrating an exemplary embodiment of an MRAM bank 110. MRAM bank 110 includes a control circuit 206, a read/write circuit 216, and an MRAM array 210. Read/write circuit 216 includes a row circuit 202 and a column circuit 204. The MRAM array 210 includes memory cells 212.

Row circuit 202 is electrically coupled to word lines 220a–220c and column circuit 204 is electrically coupled to bit lines 222a–222c. Row circuit 202 and column circuit 204 are used to read and write data to memory cell 212. Control circuit 206 is electrically coupled to row circuit 202 and column circuit 204 through conductive read/write path 214. Control circuit 206 is electrically coupled to a device controller, such as device controller 100a through path 112a.

The memory cells 212 are arranged in rows and columns, with the rows extending along an x-direction and the columns extending along a y-direction. Only a relatively small number of memory cells 212 are shown to simplify the illustration. In practice, the array 210 can be any suitable size and can utilize highly parallel modes of operation, such as 64-bit wide or 112-bit wide operation.

In the exemplary embodiment, word lines 220a–220c extend along the x-direction in a plane on one side of array 210 and bit lines 222a–222c extend along the y-direction in a plane on an adjacent side of array 210. There is one word line 220a–220c for each row of array 210 and one bit line 222a–222c for each column of array 210. A memory cell 212 is located at each intersection or cross-point of a word line 220a–220c and a bit line 222a–222c.

The memory cells 212 are not limited to any particular type of device. memory cells 212 can be, for example, spin dependent tunneling junction devices, anisotropic magnetoresistive devices, giant magnetoresistive devices, colossal magnetoresistive devices, extraordinary magnetoresistive devices or very large magnetoresistive devices.

Control circuit 206 includes circuits for communicating with a device controller, such as device controller 100a, and read/write circuit 216. Control circuit 206, read/write circuit 216, and array 210 can be formed on a single substrate or arranged on separate substrates. In the exemplary embodiment, control circuit 206, read/write circuit 216, and array 210 are formed on the same substrate.

Control circuit 206 controls read/write circuit 216 to write data into array 210 and read data from array 210. Control circuit 206 receives write commands, write addresses, and data from a device controller, such as device controller 100a through path 112a. Control circuit 206 receives read commands and read addresses from a device controller, such as device controller 100a through path 112a.

Read/write circuit 216 provides write currents through word lines 220a–220c and bit lines 222a–222c to write memory cells 212 in array 210. To write a selected memory cell 212, row circuit 202 provides a first write current through a selected word line 220a–220c and column circuit 204 provides a second write current through a selected bit line 222a–222c. Row circuit 202 can provide the first write current through the selected word line 220a–220c in either direction as needed for writing the selected memory cell 212. Column circuit 204 can provide the second write current through the selected bit line 222a–222c in either direction as needed for writing the selected memory cell 212. One read/write circuit 216 is illustrated as coupled to array 210. In practice, any suitable number of read/write circuits can be coupled to array 210. In addition, array 210 can include any suitable number of memory cells 212. The memory cells 212 in array 210 can be written to and read from in highly parallel modes.

Row circuit 202 selects one word line 220a–220c and column circuit 204 selects one bit line 222a–222c to set or switch the orientation of magnetization in the sense layer of the memory cell 212 located at the cross-point of the selected word line 220a–220c and bit line 222a–222c. Row circuit 202 provides the first write current to the selected word line 220a–220c and column circuit 204 provides the second write current to the selected bit line 222a–222c. The first write current creates a magnetic field around the selected word line 220a–220c, according to the right hand rule, and the second write current creates a magnetic field around the selected bit line 222a–222c, according to the right hand rule. The magnetic fields combine to set or switch the orientation of magnetization in the sense layer of the selected memory cell 212.

To read data from array 210, read/write circuit 216 selects one word line 220a–220c and one bit line 222a–222c to sense the resistance through the memory cell 212 located at the cross-point of the selected word line 220a–220c and bit line 222a–222c. Row circuit 202 selects a word line 220a–220c and column circuit 204 selects a bit line 222a–222c. Row circuit 202 electrically couples the selected word line 220a–220c to ground. Column circuit 204 provides a constant sense voltage on the selected bit line 222a–222c to produce a sense current through the selected memory cell 212. The magnitude of the sense current through the selected memory cell 212 corresponds to the resistive state and the logic state of the selected memory cell 212. Column circuit 204 senses the magnitude of the sense current and provides a logic output signal to control circuit 206. The logic output signal is a high or low logic level indicating the resistive state of the selected memory cell 212.

Figure 4:
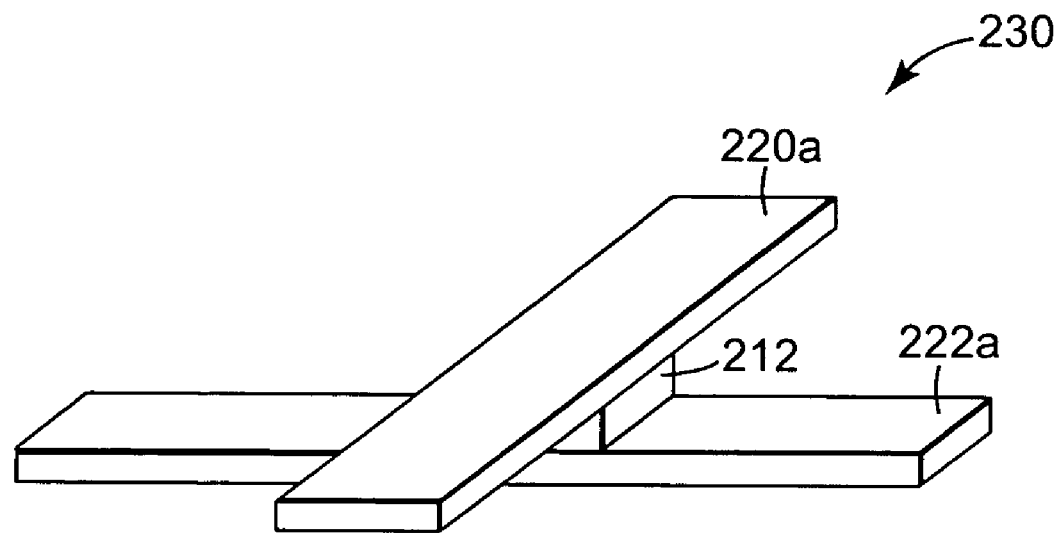
FIG. 4 is a diagram illustrating an exemplary embodiment of an array section.

FIG. 4 is a diagram illustrating an exemplary embodiment of an array section 230. Array section 230 includes word line 220a, a memory cell 212, and bit line 222a. Memory cell 212 is located between word line 220a and bit line 222a. In the exemplary embodiment, word line 220a and bit line 222a are orthogonal to one another. In other embodiments, word line 220a and bit line 222a can lie in other suitable angular relationships to one another.

In the exemplary embodiment, word line 220a and bit line 222a are electrically coupled to read/write circuit 216. Read/write circuit 216 provides write currents to word line 220a and bit line 222a to create magnetic fields, according to the right hand rule, around word line 220a and bit line 222a, and in memory cell 212. The magnetic fields combine to set or switch the state of memory cell 212.

Figure 5:
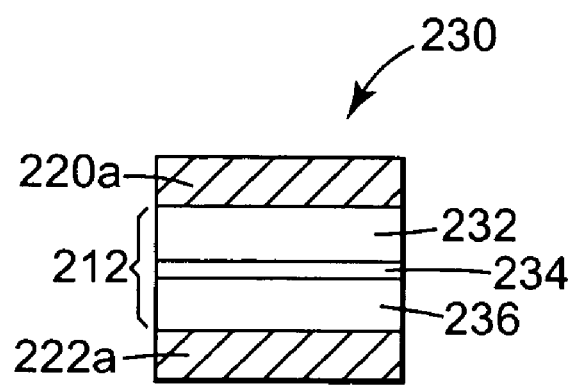
FIG. 5 is a diagram illustrating a cross section of an exemplary embodiment of an array section.

FIG. 5 is a diagram illustrating a cross section of the exemplary embodiment of array section 230. The array section 230 includes memory cell 212 located between word line 220a and bit line 222a. Memory cell 212 includes a sense layer 232, a spacer layer 234, and a reference layer 236. Spacer layer 234 is located between sense layer 232 and reference layer 236. Sense layer 232 is located next to word line 220a, and reference layer 236 is located next to bit line 222a. Sense layer 232 has an alterable orientation of magnetization and reference layer 236 has a pinned orientation of magnetization.

In the exemplary embodiment, memory cell 212 is an MTJ, spin tunneling device with spacer layer 234 being an insulating barrier layer through which an electrical charge tunnels during read operations. Electrical charge tunneling through spacer layer 234 occurs in response to a voltage applied across memory cell 212. In an alternative embodiment, a GMR structure can be used for memory cell 212 with spacer layer 234 being a conductor, such as copper.

Figure 6:
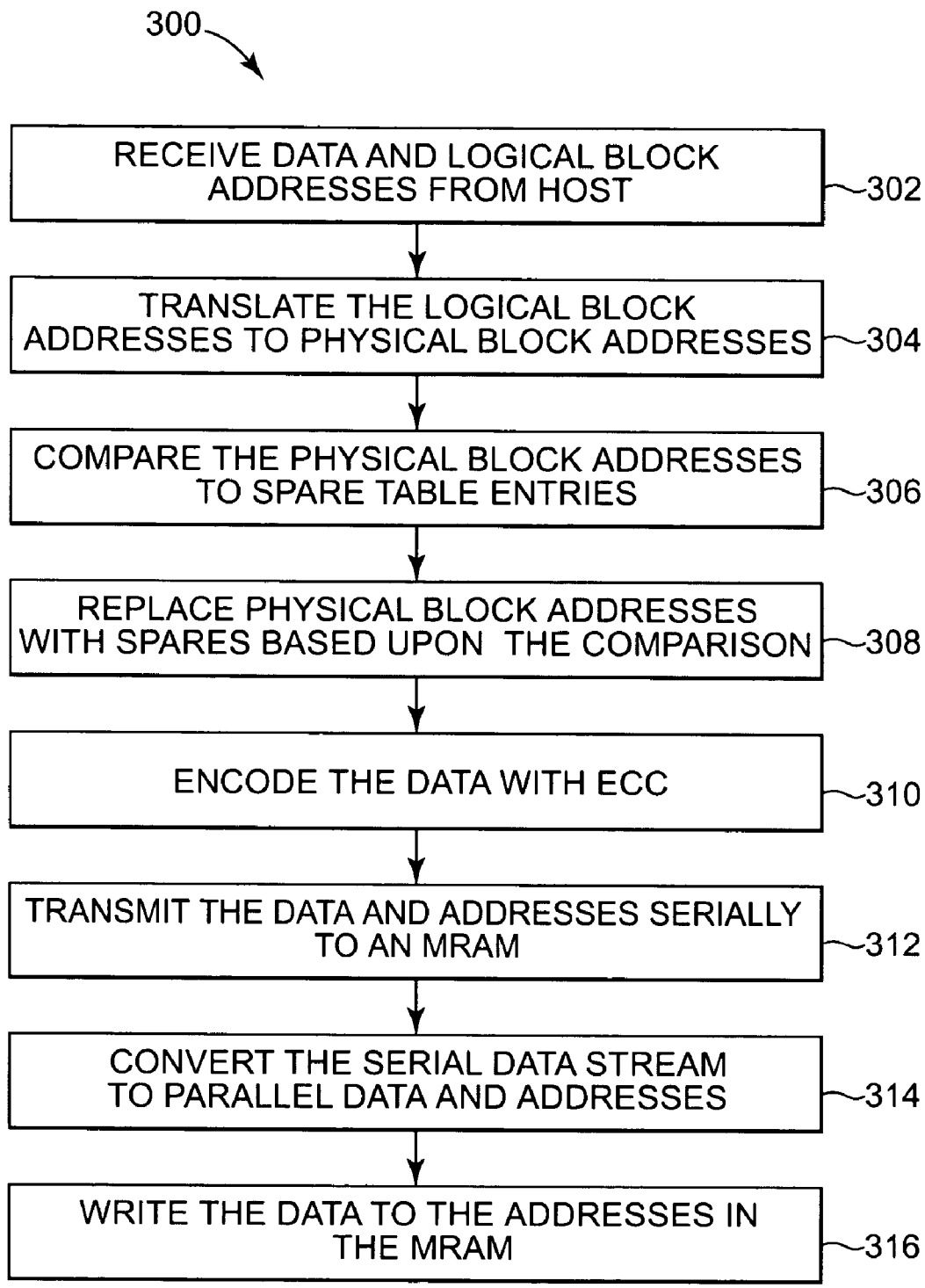
FIG. 6 is a flow diagram illustrating an exemplary embodiment of a method for writing data to an MRAM storage device.

FIG. 6 is a flow diagram illustrating an exemplary embodiment of a method 300 for writing data to MRAM 36 from host 40. At 302, main controller 32, and more particularly host interface 44, receives from host 40 a write command, data, and the LBA addresses where the data is to be stored. The data and LBA addresses are passed to device interface 48. At 304, device interface 48 translates the LBA addresses to PBA addresses. At 306, the PBA addresses are compared to original addresses stored in spare table 62. At 308, the PBA addresses that match original addresses in spare table 62 are replaced with corresponding spare addresses. At 310, ECC encoder 70 encodes the data. At 312, device interface 48 transmits the data and addresses in a serial data stream to MRAM 36 through communication link 34. At 314, a device controller, such as device controller 100a, converts the serial data stream to parallel data and addresses. At 316, the device controller writes the data to the addresses in the MRAM banks, such as MRAM banks 110a–110(m).

Figure 7:
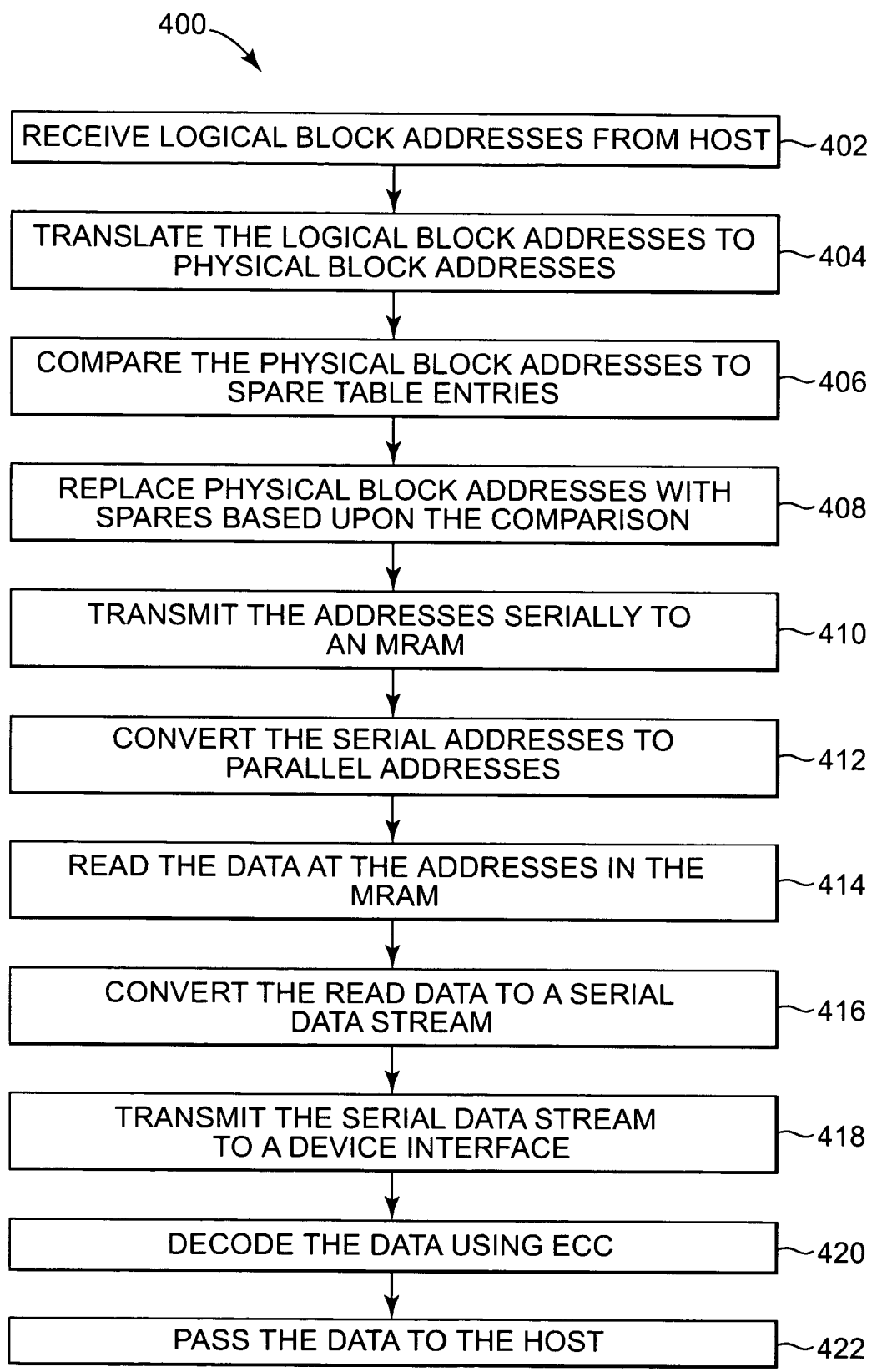
FIG. 7 is a flow diagram illustrating an exemplary embodiment of a method for reading data from an MRAM storage device.

FIG. 7 is a flow diagram illustrating an exemplary embodiment of a method 400 for reading data stored in MRAM 36. At 402, main controller 32, and more particularly host interface 44, receives from host 40 a read command and LBA addresses to read data from. Host interface 44 passes the LBA addresses to device interface 48. At 404, device interface 48 translates the LBA addresses to PBA addresses. At 406, device interface 48 compares the PBA addresses to original addresses stored in spare table 62. At 408, device interface 48 replaces the PBA addresses with corresponding spare addresses based upon the comparison. At 410, device interface 48 transmits the addresses serially to MRAM 36. At 412, MRAM 36, and more specifically a device controller, such as device controller 100a, converts the serial addresses to parallel addresses. At 414, the data is read from the addresses in the MRAM banks, such as MRAM banks 110a–110(m). At 416, the read data is converted to a serial data stream in the device controller. At 418, the serial data stream is transmitted to device interface 48. At 420, ECC decoder 72 decodes the read data. At 422, the decoded data is passed to the host 40.

Embodiments of the invention provide a solid state storage device. The storage capacity and data transfer rate of the storage device are scalable. The storage device provides a reliable and rugged (no moving parts), low cost, low power, non-volatile storage device capable of replacing disk drives in a variety of applications.

What is claimed is:

1. A memory device comprising:
a main controller including a host interface and a device interface;
a first plurality of arrays of magneto-resistive random access memory (MRAM) cells;
a first device controller coupled to the device interface and the first plurality of arrays;
a second plurality of arrays of MRAM cells; and
a second device controller coupled to the device interface and the second plurality of arrays,
wherein the first device controller is configured to communicate with the device interface to pass first data between the first plurality of arrays and the host interface, and wherein the second device controller is configured to communicate with the device interface to pass second data between the second plurality of arrays and the host interface.

2. The memory device of claim 1, wherein the first device controller and the second device controller communicate with the device interface through a serial communication link.

3. The memory device of claim 2, wherein the first device controller converts a first serial signal into a first parallel signal for writing to the first plurality of arrays of MRAM cells, and wherein the second device controller converts a second serial signal into a second parallel signal for writing to the second plurality of arrays of MRAM cells.

4. The memory device of claim 1, wherein the main controller includes a spare table for storing original addresses of defective memory sections within the first plurality of arrays and the second plurality of arrays.

5. The memory device of claim 4, wherein the spare table stores spare addresses to use in place of the original addresses of defective memory sections within the first plurality of arrays and the second plurality of arrays.

6. The memory device of claim 1, wherein the host interface is configured to pass the first data between the main controller and an external device.

7. The memory device of claim 6, wherein the host interface is configured to pass the first data between the main controller and the external device through one of a serial and parallel communication bus.

8. The memory device of claim 7, wherein the one of the serial and parallel communication bus comprises one of a Small Computer System Interface (SCSI), Integrated Drive Electronics (IDE), Serial AT Attachment (SATA), Industry Standard Architecture (ISA), Personal Internet Client Architecture (PCA), Peripheral Component Interconnect (PCI), Universal Serial Bus (USB), and InfiniBand bus.

9. The memory device of claim 1, wherein the main controller includes a data buffer to temporarily store the first data as the first data is passed between the device interface and the host interface.

10. The memory device of claim 9, wherein the main controller includes a data mover configured to control the passing of the first data between the host interface and the data buffer and between the data buffer and the device interface.

11. The memory device of claim 1, wherein the main controller includes a microprocessor configured to execute instructions for controlling the host interface and the device interface.

12. The memory device of claim 1, wherein the first plurality of arrays are coupled in parallel and the second plurality of arrays are coupled in parallel.

13. The magnetic memory storage device of claim 1, wherein the device interface comprises an error detection and correction circuit for encoding and decoding the data.

14. The memory device of claim 1, wherein the main controller is fabricated entirely on a semiconductor chip.

15. The memory device of claim 1, wherein the first plurality of arrays, the second plurality of arrays, the first device controller, and the second device controller are fabricated entirely on a semiconductor chip.

16. The memory device of claim 1, wherein the main controller, the first plurality of arrays, the second plurality of arrays, the first device controller, and the second device controller are fabricated entirely on a semiconductor chip.

* * * * *